United States Patent [19]

Nagasawa et al.

[11] 4,273,858
[45] Jun. 16, 1981

[54] RESIST MATERIAL FOR MICRO-FABRICATION WITH UNSATURATED DICARBOXYLIC MOIETY

[75] Inventors: Kohtaro Nagasawa, Tokyo; Hideo Ochi, Kawasaki; Fujio Tanaka, Koshigaya; Yumi Shibata, Tokyo, all of Japan

[73] Assignee: Somar Manufacturing Co., Ltd., Tokyo, Japan

[21] Appl. No.: 926,067

[22] Filed: Jul. 19, 1978

[51] Int. Cl.$^3$ .............................................. G03C 5/00
[52] U.S. Cl. ................................. 430/296; 430/281; 430/287; 430/313; 430/323; 430/325; 430/942; 430/967; 204/159.15; 204/159.19
[58] Field of Search ................ 96/35.1, 36, 115 R; 427/43, 44, 54; 260/837 R; 204/159.15, 159.19, 159.23; 430/281, 287, 296, 313, 942, 966, 967, 323, 325

[56] References Cited

U.S. PATENT DOCUMENTS

| | | | |
|---|---|---|---|
| 3,367,992 | 2/1968 | Bearden | 260/837 R |
| 3,647,520 | 3/1972 | Gor et al. | 427/44 |
| 3,697,351 | 10/1972 | Harmer et al. | 156/272 |
| 3,703,402 | 11/1972 | Cole | 427/44 X |
| 3,720,592 | 3/1973 | Mani | 204/159.15 |
| 3,881,935 | 5/1975 | Apellaniz | 430/287 |
| 3,933,746 | 1/1976 | Steele | 430/287 X |
| 4,001,462 | 1/1977 | Blin et al. | 427/44 |
| 4,020,233 | 4/1977 | Morgan | 427/44 X |
| 4,022,927 | 5/1977 | Pfeiffer et al. | 430/967 X |
| 4,059,480 | 11/1977 | Ruh et al. | 430/967 X |
| 4,108,844 | 8/1978 | Kawai | 96/115 R X |

FOREIGN PATENT DOCUMENTS 600234 6/1960 Canada ...................................... 430/287

*Primary Examiner*—Edward C. Kimlin
*Attorney, Agent, or Firm*—Sughrue, Rothwell, Mion, Zinn and Macpeak

[57] ABSTRACT

A resist material for micro-fabrication comprising a polymer in which the polymer backbone has thereon a moiety of the formula (I)

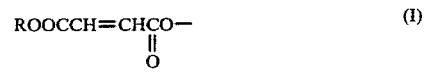

wherein R represents a hydrogen atom, an alkyl group, an alkenyl group or an aryl group or an aralkyl group, the resist material being curable by electromagnetic radiation such as electron beams, X-rays or deep ultraviolet light with a wave length of less than about 3000Å and being particularly suitable as a micro-fabrication resist material.

5 Claims, No Drawings

RESIST MATERIAL FOR MICRO-FABRICATION WITH UNSATURATED DICARBOXYLIC MOIETY

BACKGROUND OF THE INVENTION

1. Field of the Invention

The invention relates to a micro-fabrication resist material which can readily be polymerized and insolubilized and to methods of using this resist material.

2. Description of the Prior Art

Micron order fabrication represented by IC's and LSI's is ordinarily conducted by photo-lithography using a photo resist. However, ultra-fine fabrication on a sub-micron order recently has been needed, making it impossible to use photo-lithography employing photo-resist. Therefore, studies were begun on the resist material and on lithography utilizing electromagnetic radiation with short wavelengths such as electron beams and X-rays, replacing the use of near ultraviolet and ultraviolet light. Use of this resist material is similar to use of a photo-resist and the procedure is described as follows. The substrate surface is coated with the resist material and a thin layer of a polymer is formed on the substrate surface by evaporating the solvent. The coated substrate is then exposed to electromagnetic radiation such as electron beams, X-rays or deep ultraviolet light and the polymer is cross linked and as a result insolubilized in the exposed portion. When in the next step the substrate is developed with an appropriate solvent, the exposed portion of the polymer layer remains and the unexposed portion of the polymer is washed away. The above-described resist material is usually categorized as a negative-type resist material. The resist material of this invention is a negative type resist material. The substrate having thereon the insoluble resist is subjected to doping, metallizing, and etching processing, etc. The fabrication process is completed by removing the resist with a solvent or plasma ashing.

As is evident from the fabrication method described above, the resist material must be have sufficiently high photoproperties such as sensitivity, contrast, resolution, edge sharpness, must be adhesive to the substrate and resistant to the ethchant and must have sufficient shelf life. Furthermore, the resist material should preferably not be so photo-sensitive that it must be processed in dark room. The resist material of this invention shows a high sensitivity to electromagnetic radiation of a wavelength less than about 3000 Å, such as electron beams, X-rays, deep ultraviolet light (wavelength of approximately 2700 Å to 1500 Å). It is of value to mention here that the hitherto known negative type resist materials are decomposed by deep ultraviolet light irradiation resulting in a poor positive image. On the other hand, the resist material of this invention provides a very clear negative image as shown in the examples given hereinafter.

Sensitivity of the resist material is indicated by the dose of electromagnetic radiation required to insolubilize the resist material in the case of a nega-type resist material. In case of electron-beams that are most often utilized, contrast ($\gamma$) is attained at ($\gamma = 1$ or above) supposing $D^i$ as the minimum dose for starting insolubilization and $D^\circ$ as a sufficient dose for 100% insolubilization. In order to permit a resist material to be used practically, $D^\circ \leq 10^{-6}$ coulomb/cm$^2$ and contrast $\geq 1$ are ideal. A study of lithography using electromagnetic radiation (mainly electron beams) began in the last half of the 1960's. The resist material utilized initially was a common photo-resist. A photo-resist was an appropriate material for evaluation because its basic characteristics such as electro-sensitivity, adhesiveness to a substrate such as a silicon wafer, coatability, and resistance to etchants were sufficiently high. However, the properties of such a photo-resist were insufficient for electron beams, X-rays or deep ultraviolet light lithography to be put into practice. For instance, the sensitivity of a negative type photo-resist to electron beams was low, i.e., $D^\circ > 10^{-5}$ and this low sensitivity was a decisive disadvantage for spot scanning of electron beams which was used for mask production with a CAD. Around 1970, electron beam resist materials were announced. Among the many electron beam resist materials, a highly sensitive resist material with a $D^\circ$ approaching on the order of $10^{-8}$ coulomb/cm$^2$ was developed. Such, however, had inferior contrast and was totally unsuitable for practical use. A photo-resist of another type, despite its good sensitivity and contrast, did not become practical due to difficulty in synthesis. A photo-resist material for submicron fabrication which is suitable for practical use has yet to be developed.

SUMMARY OF THE INVENTION

In view of the current situation, materials suitable for lithography using electromagnetic radiation such as electron beams, X-rays or deep ultraviolet light with a wavelength of 3000 Å or less were investigated and ultimately a resist material suitable for practical application was developed. Thus, the present invention provides a resist material with high sensitivity and contrast which can be readily polymerized and insolubilized using electromagnetic radiation such as electron beams, X-rays or deep ultraviolet light. The resist material of the present invention suitable for micro-fabrication is not practically photo-sensitive, and can be handled in the light, can be manufactured without dificulty, and greatly contributes to development of micro-fabrication techniques due to its wide applications.

The present invention provides a resist material for micro-fabrication comprising a backbone polymer having thereon a moiety of the formula (I)

$$\text{ROOCCH=CHCO—} \quad (I)$$
$$\overset{\|}{O}$$

wherein R is a hydrogen atom, an alkyl group, an alkenyl group, an aryl group or an aralkyl group, with the resist material having good coatability and being a solvent-soluble polymer.

DETAILED DESCRIPTION OF THE INVENTION

The moiety of the formula (I) above, hereinafter "1,2-ethylenic dicarboxylic moiety", can be advantageously introduced into a backbone polymer using, a monoester of maleic acid, a monoester of fumaric acid, or maleic anhydride. The backbone polymer to which the 1,2-ethylene dicarboxylic acid derivative is bonded comprises repeating units of a monomer or monomers such as vinyl acetate, vinyl propionate, vinyl chloride, methyl vinyl ketone, vinyl isocyanate vinyl pyrrolidone acrylonitrile, ethyleneoxide, an alkyl acrylate, an alkyl methacrylate, butadiene, isoprene, acrylamide, styrene, itaconic acid, maleic anhydride and the like.

About 1% to 100% of the monomer units of the backbone polymer have thereon functional groups such as amino groups, hydroxyl groups and epoxy groups or ethylenically unsaturated bonds, etc. capable of chemically bonding with the 1,2-ethylenic dicarboxylic moiety.

The description on the backbone polymer set forth above is given for the purposes of illustration is not to be considered to limit the scope of this invention.

From a practical standpoint, there is no limit on the molecular weight of the backbone polymer. However, the molecular weight usually ranges from about $1 \times 10^4$ to about $1 \times 10^7$. A polymer having a narrow molecular weight distribution is desirable. Conventionally utilized reactions, such as esterification, addition, amidation, etc. can be employed to introduce the 1,2-ethylene dicarboxylic moiety into the backbone polymer.

When an amino group is employed as the functional group, a polymer having a secondary amino group is contacted with an acid halide containing the moiety of the formula (I) at room temperature for several hours in the presence of a solvent, or with an acid anhydride containing the moiety the formula (I) at room temperature to about 100° C. for several hours in the presence of a solvent. Examples of solvents which can be used include ethers (e.g., dioxane), ketones (methyl ethyl ketone), aromatic solvents (e.g., toluene), etc.

When a hydroxyl group is employed as the functional group, a polymer having a hydroxyl group is contacted with an acid halide or an acid anhydride containing the moiety of the formula (I) under the same conditions as those in the case of the introduction of the amino group as described above.

When an epoxy group is employed as the functional group, a polymer containing an epoxy group is contacted with a carboxylic acid directly or in solution in the presence or absence of a solvent and, if desired, using a catalyst, at a temperature of about 60° to about 120° C.

When an ethylenically unsaturated bond is introduced onto the polymer backbone, a polymer having an ethylenically unsaturated bond (such as a styrene-butadiene copolymer) is contacted with a carboxylic acid containing the moiety of the formula (I) at room temperature to about 100° C. for several hours in the presence of a Lewis acid, and a solvent such as dichloroethane, benzene, toluene, etc.

Examples of the synthesis of the resist material of this invention are given below. Unless otherwise indicated, all parts, percents, ratios and the like are by weight.

SYNTHESIS EXAMPLE 1

10 g. of a styrene-butadiene rubber (SBR); (styrene:-butadiene=40:40 (molar ratio); molecular weight; $2 \times 10^{-6}$) synthesized by solution polymerization was dissolved in 250 ml. of 1,2-dichloroethane in a reaction vessel. To the solution of SBR, 2.4 g. of monoallyl maleate and 0.4 ml. of borontrifluoride etherate were added. The mixture was stirred for 5 hours under a dry nitrogen atmosphere. The reaction mixture was poured into 1 l. of ethanol, and 10.5 g. of the monoallyl maleate derivative of SBR which showed a characteristic I.R. absorption band at 1720 cm$^{-1}$ attributable to a carbonyl group precipitated.

SYNTHESIS EXAMPLE 2

10 g. of the same SBR as described in Synthesis Example 1 above was dissolved in 250 ml. of 1,2 dichloroethane. To the SBR solution, 2.0 g. of monoethyl fumarate and 0.4 ml. of borontrifluoride etherate were added thereto. After the mixture had been stirred for 5 hours at 83° C. under a nigrogen atmosphere, the solution was added to 1 l. of methanol to obtain 10.0 g. of the monoethyl fumarate derivative of SBR which was pale yellow and showed an I.R. absorption of 1720 cm$^{-1}$ attributable to a carbonyl group.

SYNTHESIS EXAMPLE 3

Distilled methyl methacrylate and 2-hydroxyethyl methacrylate (molar ratio=85:15) were added to a glass ampule. Then, 1 wt.% of azobisisobutyronitrile based on the weight of these monomers was added with toluene in an equal weight to the monomers. After the ampule had been evacuated and purged with nitrogen, the ampule was sealed. The ampule was set in an incubator for 24 hours at 60° C. The reaction mixture was dissolved in acetone and precipitated in methanol. The molecular weight of the polymer obtained was $5 \times 10^4$. 1.0 g. of this polymer, and 2.9 g. of triethylamine were added to 30 ml. of N-methylpyrrolidone. To the above mixture, 4.72 g. of monoethyl fumaroyl chloride was added dropwise at 5° C. The mixture was then stirred at room temperature for 12 hours and stirring was continued at 60° C. for 5 hours. The reaction mixture was filtered and poured into water to obtain 13.0 g. of a brown colored monoethyl furmarate ester of the polymer. The crude product was purified by repeating the purification via reprecipitation with N-methylpyrrolidone and methanol as a nonsolvent.

SYNTHESIS EXAMPLE 4

2.0 g. of poly-(1,4-butadiene) comprising 3.3% by weight of the cis-isomer and 53% by weight of the trans-isomer and containing a vinyl content of 14% by weight and with a molecular weight of $1.6 \times 10^5$, and 4.5 g. of monoethyl maleate were dissolved in 50 ml. of 1,2-dichloroethane. To the above solution, 0.9 g. of t-butylhypochlorite was added and the reaction mixture was kept at room temperature for a week. The reaction mixture was added to methanol to obtain 5.2 g. of yellow colored monoethyl fumarate derivative of polybutadiene. The polymer showed an I.R. absorption at 1720 cm$^{-1}$ characteristic of the carbonyl group.

The polymer of this invention having thereon the 1,2-ethylene dicarboxylic moiety can be employed as a resist material for micro-fabrication in the form of a solution in a volatile solvent with an appropriate boiling point.

The volatile solvent dissolves the polymer, and the polymer solution is coated on the surface of a substrate to form a thin film of the resist material after evaporation of the solvent. For this purpose, the solvent should be capable of being evaporated with heating at a temperature under 120° C. to form a thin film and must not be corrosive to the substrate on which it is coated. Suitable examples of solvents for the resist material include haloalkanes such as 1,1,1-trichloroethane, dichloroethanes, carbon tetrachloride, etc., esters such as ethyl acetate, isoamyl acetate, methyl Cellosolve acetate, alcohols such as ethyl alcohol, butyl Cellosolve, etc., ethers such as as dioxane, tetrahydrofuran, etc., and aprotic solvents such as N,N-dimethylformamide, N-methylpyrrolidone, etc. A mixture of two or more solvents can also be used, if desired.

The examples of suitable volatile solvents given above are for the purpose of illustration and are not to be considered as limited the present invention. The type of polymer used and the solvent employed are selected based on the end-use application.

Also, the concentration of the polymer in the solution and type of polymer used will vary depending on the end-use application but normally a suitable polymer concentration is about 5 to 30% by weight.

Next, the application of the resist material of this invention to the ultra fine process is described below.

A polymer solution is rotatingly coated on a substrate such as a silicon water, and if necessary, depending on type of solvent used, the coated substrate is heated to a temperature not more than 200° C. whereby the solvent is removed.

Using this coating method, a thin film layer of the resist material with the thickness of less than 30,000 Å can easily be formed.

The resist material of this invention is usually used in the form of thin film layer with a thickness of about 2,000 Å to about 30,000 Å on a substrate. The thickness of the resist layer is predetermined to optimize the fabrication desired. Where the thickness of the thin film is less than about 2,000 Å there is the possibility of undesirable pinhole formation.

With this method, a thin film of the polymer, with a thickness of less than about 30,000 Å, is formed. If this thin film polymer is irradiated with e.g., electron beams, the irradiated portion become insoluble in a solvent and a negative type resist image can be obtained through development with an appropriate solvent.

The dose of electromagnetic radiation is generally determined so that about 50 to about 100% of the initial thickness of the resist layer after development remain as the result of crosslinking. Where the pattern made of the resist after development is to be used as the resist for etching processes, the resist material can be postbaked at about 20° C. to about 250° C. to strengthen the resist.

The resist material of this invention can be employed in producing LSI's, VLSI's (very large scale integrated circuits), surface acoustic wave elements, bubble memories and other microelectronic devices. Furthermore, the resist material can be used for mother mask making for photolithography, X-ray lithography, deep ultra violet lithography, etc. The material also is feasible for producing microfilm, video tape-recording, etc. images.

Some examples of the use of the resist material are described in detail below.

EXAMPLE 1

A 15% by weight solution of a polymer produced as described in Synthesis Example 1 in cyclohexanone was filtered through a 0.2 micron membrane filter, and spinner coated (5,000 rpm) onto the surface of a glass plate having a vacuum deposited layer thereon (dry thickness 2,000 Å) and dried for about 15 minutes at 80° C. to form an element having a thin polymer film of a thickness of 3,000 Å thereon. Using a scanning electron microscope, the element was irradiated with electron beams (27 KeV acceleration voltage) in amounts which varied stepwise. After irradiation with the electron beams, the element was developed with isoamyl acetate and the thickness of the film remaining was measured with an interference microscope. The following results were obtained $D^i = 3.0 \times 10^{-7}$ coulomb/cm$^2$; $D° = 1.6 \times 10^{-6}$ coulomb/cm$^2$; $\gamma = 1.38$.

A thin polymer film of a thickness of 3,000 Å was formed on the evaporated aluminum surface of another element produced as described above, and electron beams (acceleration voltage 10 KeV) were narrowly focussed and to $1.5 \times 10^{-10}$ coulomb at about 1 cm. After irradiation with the electron beams, the element was developed with isoamyl acetate to obtain a resist line of a width of 0.7 micron.

After post baking the element for 10 minutes at 120° C., the element was immersed for 3 minutes in an etchant solution at 25° C. (phosphoric acid:nitric acid:acetic acid:water:16:1:2:1 by weight).

After washing with pure water, the element was immersed in a commercially available resist removal solution (Tokyo Ohka OMR 501) at 100° C. for about 5 minutes and the resist was peeled off. An aluminum line of a width of 0.7 micron was obtained. No side etching was observed as a result of the etching.

EXAMPLE 2

A 15% xylene solution of a polymer produced as described in Synthesis Example 2 was filtered through a 0.2 micron membrane filter, and spinner coated (4,000 rpm) onto the surface of a silicon wafer having thereon an oxide layer of a thickness of 3,000 Å produced by heat oxidation and dried for 10 minutes at 80° C. to obtain an element with a thin polymer film of a thickness of 3,500 Å thereon.

Using the irradiation procedures as described in Example 1 the element was irradiated with electron beams (acceleration voltage of 27 KeV) and then developed in isoamyl acetate. The results obtained were as follows: $D^i = 7.5 \times 10^{-8}$ coulomb/cm$^2$; $D° = 7.2 \times 10^{-7}$ coulomb/cm$^2$; $\gamma = 1.02$.

Likewise, a thin polymer film of a thickness of 3,500 Å was produced on a silicon wafer as described above, and, in a similar manner as described in Example 1, the electron beam (acceleration voltage: 10 KeV $1.0 \times 10^{-6}$ coulomb/cm$^2$) was narrowly focussed on the film surface applying the beam in a line, developed in isoamyl acetate and a resist line of a width of 0.6 micron was obtained.

After post baking for 10 minutes at 120° C., the element was immersed for 5 minutes into an etching solution (aq. 40% NH$_4$F:aq. 56% HF=6:1) at 25° C.

After washing with pure water, the resist was removed using procedures similar to those described in Example 1 and a silicon line of a width of 0.6 micron was obtained. The adhesion on the resist was excellent and anti-corrosion was good. Side etching and peeling during etching were not observed.

EXAMPLE 3

A 5% solution in N-methylpyrrolidone of a polymer produced as described in Synthesis Example 3 was filtered through a 0.2 micron membrane filter and in a similar manner to Example 1 was spinner coated on a vacuum deposited aluminum surface on a glass plate, dried for 10 minutes at 80° C. and a thin film of the polymer of a thickness of 2,500 Å was obtained. Using the irradiation procedures described in Example 1, the element was irradiated with electron beams (acceleration voltage of 27 KeV) in a stepwise manner. The element was developed in methyl ethyl ketone and the following results were obtained: $D^i = 1.7 \times 10^{-7}$ coulomb/cm$^2$; $D° = 1.8 \times 10^{-6}$ coulomb/cm$^2$; $\gamma = 1.03$.

EXAMPLE 4

A 10% cyclohexanone solution of a polymer produced as described in Synthesis Example 4 was filtered through 0.2 micron membrane filter, and spinner coated on the vacuum deposited aluminum surface of a glass plate to form a thin film of the polymer of a dry thickness of 3,200 Å. On repeating the electron beam irradiation procedures as described in Example 1, the following results were obtained: $D^i = 1.8 \times 10^{-7}$ coulomb/cm$^2$; $D^\circ = 1.2 \times 10^{-6}$ coulomb/cm$^2$; $\gamma = 1.2$.

EXAMPLE 5

15 g of a polymer produced as described in Synthesis Example 1 was dissolved in 100 cc of cyclohexanone, and the resulting solution was coated on a silicon substrate in the same manner as described in Example 1 and prebaked at 80° C. for 30 minutes to form a polymer thin film having a thickness of 5000 Å. This thin film was irradiated with soft X-rays (Mo L 5.4 Å) under a nitrogen atmosphere. The irradiation energy was measured using a gas flow-type proportional counter. The resolution property was measured using a silicon membrane mask having a gold pattern thereon. The polymer thin film was spaced 15000 Å from the mask.

After the irradiation with X-rays, the substrate was immersed in methyl ethyl ketone at 25° C. and then rinsed with dichloroethane, followed by developing the resist. The dose of X-rays ($D^{0.5}$) necessary for 50% of the coated film to be insolubilized and to remain after the development was 30 mJ/cm$^2$, and the resulting material faithfully reproduced the gold pattern of a pitch of 8000 Å. Further, using this thin film as a resist, the silicon substrate was subjected to ion etching with argon ions to a depth of 1000 Å, and the resist was removed by ashing in an oxygen plasma, whereby a precise silicon pattern was obtained.

EXAMPLE 6

15 g of a polymer produced as described in Synthesis Example 1 was dissolved in 100 cc of cyclohexanone. The resulting solution was coated on a glass substrate having a vacuum deposited layer of chromium thereon (chromium: 1000 Å) in the same manner as described in Example 5 and dried to form a thin film having a thickness of 6000 Å. The thin film was irradiated with a 10 W low pressure mercury lamp at a distance of 10 cm through a pattern mask of artificial quartz glass in an nitrogen atmosphere, and then developed in the same manner as in Example 5 to obtain a negative-type image within an irradiation period of time of 5 minutes. The element was then postbaked at 150° C. for 30 minutes, immersed in a perchloric acid solution of ammonium cerium (IV) nitrate, and etched. The resulting material was washed with water and dried, and the polymer thin film was swollen with acetone, and then rubbed to obtain a precise chromium pattern.

While the invention has been described in detail and with reference to specific embodiments thereof, it will be apparent to one skilled in the art that various changes and modifications can be made therein without departing from the spirit and scope thereof.

What is claimed is:

1. A method of producing a resist pattern which comprises, irradiating with electrons, X-rays, or deep UV radiation having a wavelength of 3,000 Angstroms or less a substrate having thereon a thin film of a resist material consisting essentially of a polymer having a backbone formed of monomer units wherein about 1 to 100% of said monomer units contain functional group(s) bonded to an $\alpha,\beta$-unsaturated dicarboxylic moiety of the formula (I):

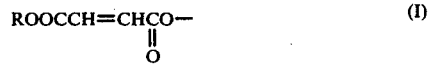

wherein R represents a hydrogen atom, an alkyl group, an alkenyl group, an aryl group, or an aralkyl group, the resist material being substantially non-light-sensitive but curable by electromagnetic radiation with a wavelength less than about 3,000 Å.

2. The method of claim 1, wherein the irradiation is carried out using electron beams having an acceleration voltage of 10 KeV to 27 KeV.

3. The method of claim 1, wherein the irradiation is carried out using soft X-rays.

4. The method of claim 1, wherein the irradiation is carried out using deep ultraviolet light having a wavelength of approximately 2700 Å to 1500 Å.

5. The method of claim 1, wherein said resist material is substantially insensitive to visible light.

* * * * *